US006869832B2

(12) United States Patent
Stecher

(10) Patent No.: US 6,869,832 B2
(45) Date of Patent: Mar. 22, 2005

(54) METHOD FOR PLANARIZING BUMPED DIE

(75) Inventor: Thomas E. Stecher, Scotia, NY (US)

(73) Assignee: Lockheed Martin Corporation, Bethesda, MD (US)

(*) Notice: Subject to any disclaimer, the term of this patent is extended or adjusted under 35 U.S.C. 154(b) by 155 days.

(21) Appl. No.: 10/359,818

(22) Filed: Feb. 7, 2003

(65) Prior Publication Data

US 2004/0157359 A1 Aug. 12, 2004

(51) Int. Cl.⁷ .................. H01L 21/44; H01L 21/48; H01L 21/50
(52) U.S. Cl. .................. 438/127; 438/15; 438/106; 438/118
(58) Field of Search .................. 438/15, 17, 26, 438/51, 55, 64, 106, 127, 118, 112, 107–109

(56) References Cited

U.S. PATENT DOCUMENTS

| | | | |
|---|---|---|---|
| 5,353,195 A | 10/1994 | Fillion et al. | |
| 5,353,498 A | 10/1994 | Fillion et al. | |
| 5,422,513 A | 6/1995 | Marcinkiewicz et al. | |
| 5,497,033 A | 3/1996 | Fillion et al. | |
| 5,527,741 A | 6/1996 | Cole et al. | |
| 5,736,424 A * | 4/1998 | Prybyla et al. | 438/780 |
| 5,888,837 A | 3/1999 | Fillion et al. | |
| 5,946,546 A | 8/1999 | Fillion et al. | |
| 6,048,799 A * | 4/2000 | Prybyla | 438/760 |
| 6,189,208 B1 | 2/2001 | Estes et al. | 29/840 |
| 6,239,482 B1 | 5/2001 | Fillion et al. | |
| 6,239,980 B1 | 5/2001 | Fillion et al. | |
| 6,242,282 B1 | 6/2001 | Fillion et al. | |
| 6,245,595 B1 | 6/2001 | Nguyen et al. | 438/108 |
| 6,391,798 B1 * | 5/2002 | DeFelice et al. | 438/780 |
| 6,506,679 B2 * | 1/2003 | Blalock et al. | 438/691 |
| 6,677,252 B2 * | 1/2004 | Marsh | 438/780 |
| 6,743,724 B2 * | 6/2004 | Doan et al. | 438/692 |
| 2002/0011677 A1 | 1/2002 | Yokoi et al. | 257/782 |
| 2002/0048825 A1 | 4/2002 | Young et al. | 438/4 |

FOREIGN PATENT DOCUMENTS

EP    1 087 434 A2    3/2001    .......... H01L/21/56

OTHER PUBLICATIONS

PCT Notification of Transmittal of the International Search Report and the Written Opinion of the International Searching Authority or the Declaration, mailed Jul. 22, 2004, regarding PCT/US 2004/001905 filed Jan. 23, 2004 (7 pages).

* cited by examiner

Primary Examiner—Anh Phung
Assistant Examiner—Beth E. Owens
(74) Attorney, Agent, or Firm—Baker Botts L.L.P.

(57) ABSTRACT

According to one embodiment of the invention, a method for planarizing bumped die includes providing a die having a plurality of stud bumps, encapsulating the stud bumps with an epoxy-based material, and disposing a release layer outwardly from the epoxy-based material. A surface of the release layer that engages the epoxy-based material is substantially planar. The method further includes curing the epoxy-based material and removing the release layer after the curing step, thereby creating a substantially planar surface of the epoxy-based material.

14 Claims, 1 Drawing Sheet

US 6,869,832 B2

METHOD FOR PLANARIZING BUMPED DIE

TECHNICAL FIELD OF THE INVENTION

The present invention relates generally to the field of multichip module manufacturing and, more particularly, to a method for planarizing bumped die for use in multichip modules.

BACKGROUND OF THE INVENTION

A multichip module assembler oftentimes receives integrated circuit die that have already been tested by the die manufacturer to assure that the die work correctly. These die are typically tested as a completed integrated circuit package. To utilize a particular die with a multichip module a chemical etching process is often used to remove the material encapsulating the die until the wire-bond to the lead frame is exposed. The wire from the wire-bond is clipped at the die and the wire-bond ball is then stamped to provide reasonably uniform height. This process is known as stud bumping.

The stud bumps resulting from the stud bumping process may be troublesome to multichip assemblers because voids may result between the die and the polyimide flex circuit when the die is coupled thereto. This is a result of the non-planar surface associated with the stud bumps. This severely impairs yield.

Previous methods of removing the stud bumps have been inadequate. For example, mechanical removal techniques such as grinding may ruin the die or may not be adequate to cause the planar surface. Chemical removal techniques may also ruin the die by etching away too much material, which may lead to the removal of the contact pads. These processes are also expensive.

SUMMARY OF THE INVENTION

According to one embodiment of the invention, a method for planarizing bumped die includes providing a die having a plurality of stud bumps, encapsulating the stud bumps with an epoxy-based material, and disposing a release layer outwardly from the epoxy-based material. A surface of the release layer that engages the epoxy-based material is substantially planar. The method further includes curing the epoxy-based material and removing the release layer after the curing step, thereby creating a substantially planar surface of the epoxy-based material.

Embodiments of the invention provide a number of technical advantages. Embodiments of the invention may include all, some, or none of these advantages. In one embodiment, planarized die are achieved and may be used to assemble multichip modules with assurance that voids will not occur during assembly. These planarized die may be tested by the chip manufacturer or multichip module assembler before assembly with confidence that the wire bonding will not lead to problems when assembling the multichip module. This greatly enhances yield. Another technical advantage is that the stud bumps do not have to be removed by mechanical or chemical means, which allows for extra metal on the contact pads. This means that greater laser power may be used in subsequent via formation without ruining the contact pads.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION

FIGS. 1 through 6 illustrate an example method for planarizing an integrated circuit die 100 having a plurality of stud bumps 102 before assembling to a substrate in accordance with an embodiment of the present invention. Planarized die resulting from the method outlined below may be used, in one embodiment, to assemble multichip modules with assurance that voids (e.g., pockets of trapped air) will not occur during assembly. One technical advantage of avoiding voids during the assembly of the multichip modules is that die 100 may be tested by the chip manufacturer or multichip module assembler before assembly with confidence that the wire bonding will not lead to problems when assembling the multichip module, which greatly enhances yield. Another advantage is that stud bumps 102 on die 100 do not have to be removed by mechanical or chemical means that may damage die 100. Although die 100, as described below, is being used in the assembly of multichip modules, the present invention contemplates other uses for die 100.

In addition to voids forming in the adhesive layer between the die/substrate interface when attaching die 100 with stud bumps 102 to a substrate during a multichip module assembly process, other problems may also result from attaching die 100 to a substrate with stud bumps 102 attached thereto. Therefore, according to the teachings of one embodiment of the present invention, die 100 is planarized before being assembled in a multichip module assembly process. One method of planarizing die 100 is described below in conjunction with FIGS. 1 through 5.

Figure 1:
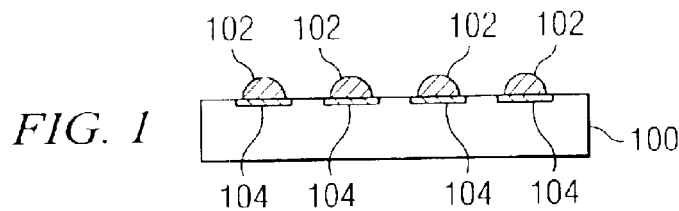
FIG. 1 is an elevation view of an integrated circuit die having a plurality of stud bumps in accordance with an embodiment of the present invention.

FIG. 1 illustrates the first step in the example method, which is the providing of integrated circuit die 100 having stud bumps 102 in accordance with an embodiment of the present invention. In one embodiment, stud bumps 102 are disposed outwardly from a plurality of respective contact pads 104. Although only one die 100 is illustrated in FIG. 1, the present invention contemplates any number of die 100 to be used within the teachings of the present invention. Typically, die 100 is a formed from a silicon or germanium wafer and includes suitable circuitry therein formed by conventional semiconductor processing techniques; however, die 100 may be any suitable integrated circuit die having any suitable use. As described above, in one embodiment, die 100 is to be used in a multichip module, as described in further detail below.

In one embodiment, stud bumps 102 are flattened wire bond balls that exist outwardly from contact pads 104 when received from the integrated circuit die manufacturer. These stud bumps 102 are the result of the stud bumping process that occurs after the testing of die 100 either at the die manufacturer or the multichip module assembler. After the die is tested, a chemical etching process or other suitable process is used to remove the material that encapsulates the die until the die with the wire bond to the lead frame is exposed. The wire from the wire bond is then clipped at the die and the wire bond ball is then stamped to provide reasonably uniform height. Die 100 with stud bumps 102 is then ready to be assembled to a flexible circuit for the multichip module manufacturing process. Stud bumps 102 may also be any suitable stud bumps or solder bumps utilized for flip chip technology, such as flip chip thermosonic compression bonding.

Contact pads 104 are any suitably sized contact pads that function to couple the circuitry within die 100 to circuitry associated with another device, such as a printed circuit board, flexible circuit, or other suitable substrate.

Figure 2:
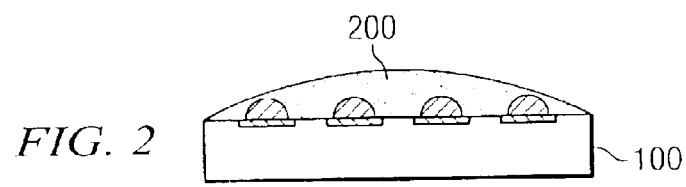
FIG. 2 is an elevation view of the die of FIG. 1 illustrating an epoxy-based material encapsulating the stud bumps.

FIG. 2 illustrates the next step in the example method, which is the encapsulating of stud bumps 102 with an epoxy-based material 200. Any suitable epoxy-based material may be utilized. Some examples are XP9500 manufactured by Shipley, the QMI series of epoxies manufactured by Loctite, the Epo-tek series manufactured by Epoxy Technology, and Ablebond 8700k or Eccobond E3200 manufactured by Emerson&Cuming. Any suitable amount of epoxy-based material 200 may be utilized; however, the amount of epoxy-based material 200 to be applied to die 100 is preferably enough to suitably encapsulate all of the stud bumps 102 and to fully cover the area of die 100. Any suitable method may be utilized to apply epoxy-based material 200 to die 100, such as the use of a syringe or placing a glob on the end of a needle and applying thereto.

Figure 3:
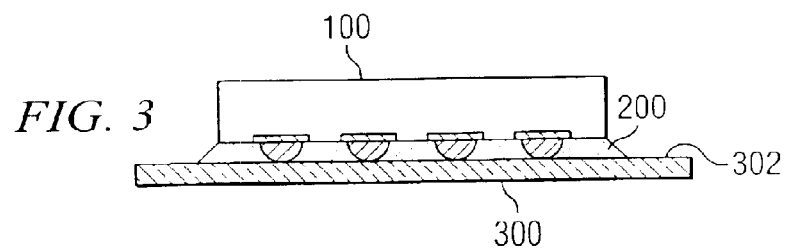
FIG. 3 is an elevation view illustrating the die flipped over and placed on a substantially planar release layer.

FIG. 3 illustrates the next step in the example method, which is to flip die 100 having epoxy-based material 200 over and place it on a release layer 300. In one embodiment, a light pressure is applied to die 100 to compress epoxy-based material 200 between die 100 and release layer 300. In one embodiment, this ensures that die 100 is resting on stud bumps 102. Release layer 300 includes a substantially planar surface 302 that functions to substantially planarize epoxy-based material 200, as described further below. Any suitable material may be utilized for release layer 300, such as glass, teflon film stretched or sprayed over glass, a suitable spray-on release agent, or other suitable release layer. It is preferable to use a material for release layer 300 that epoxy-based material 200 does not stick to. Another example of a material for release layer 300 is gold over silicon; however, this is a more expensive material to utilize. Any suitable size and thickness may be utilized for release layer 300.

Figure 4:
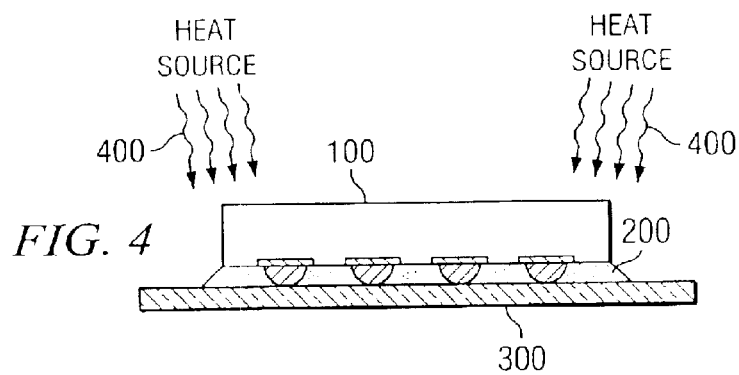
FIG. 4 is an elevation view illustrating the curing of the epoxy-based material according to one embodiment of the invention.

FIG. 4 illustrates the next step in the example method, which is the curing of epoxy-based material 200 via a heat source 400. Any suitable heat source may be utilized, such as an oven or other suitable heat source. The curing temperatures and times are highly dependent upon the type of material used for epoxy-based material 200. As example ranges, the temperature of the curing cycle may be anywhere from ambient temperature to 150° C. while the curing time may be anywhere from fifteen minutes to two hours. Again, other suitable temperatures and times may be utilized. In a particular embodiment of the present invention, epoxy-based material 200 is partially staged, which does not fully cure the material but makes it hard enough to remove from release layer 300.

Figure 5:
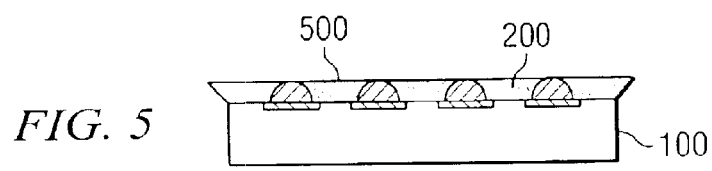
FIG. 5 is an elevation view illustrating the die after removal of the planar release layer.

FIG. 5 shows the last step in the example method, which is to remove release layer 300 after the cure, or partial cure, cycle. As illustrated in FIG. 5, the result of removing release layer 300 is that a substantially planar surface 500 of epoxy-based material 200 is achieved. Die 100 may then be attached to a substrate, such as a substrate used in multichip modules, with assurance that voids will not occur during the attachment process. An example is shown below in conjunction with FIG. 6.

Figure 6:
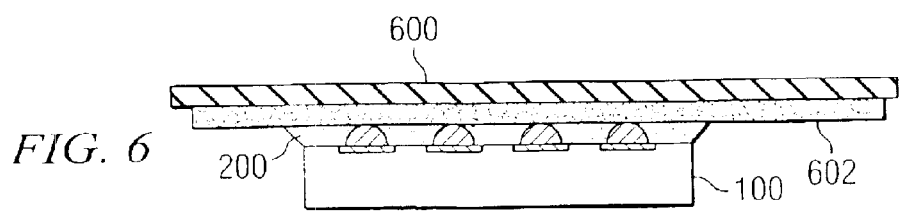
FIG. 6 is an elevation view illustrating the die being assembled to a polyimide flex circuit according to one embodiment of the invention.

FIG. 6 illustrates one example of attaching die 100 to a substrate 600 during a multichip module assembly process. As illustrated in FIG. 6, die 100 is shown to be attached to substrate 600, which in this example is a flexible circuit formed from polyimide. Other suitable materials may be utilized for substrate 600, such as any suitable polymer. Typically, substrate 600 has metal traces formed therein that need to be coupled to contact pads 104 associated with die 100. This is typically accomplished by a suitable via formation process, which is well known in the semiconductor industry.

In one embodiment, to attach die 100 to substrate 600, an adhesive layer 602 is utilized. Any suitable material may be utilized for adhesive layer 602, such as any suitable hot melt adhesives, die attach adhesives, or suitable polymer adhesives, such as epoxies. In a particular embodiment, adhesive layer 602 is formed from an Ultem polyetherimide resin. Generally, adhesive layer 602 is applied to substrate 600 before die 100 is attached to adhesive layer 602 by engaging surface 500 of epoxy-based material 200 to adhesive layer 602. Thereafter, the circuitry associated with substrate 600 may be coupled to contact pads 104 of die 100 by, for example, a suitable via formation process.

Planarizing die, such as die 100, before assembly to a substrate, such as substrate 600, in a multichip module assembly process leads to a number of technical advantages. One technical advantage is that stud bumps, such as stud bumps 102, do not have to be removed from die by mechanical or chemical means. This prevents any destruction of the die and saves time and money from not having to perform those removal processes. In addition, having stud bumps on die when attaching to substrates allows for extra metal outwardly from the contact pads, which means that greater laser power may be utilized in subsequent via formation without ruining the contact pads. Embodiments of the present invention may also be used on any suitable non-planar die in which a non-planar surface results from something other than stud bumps.

Although embodiments of the invention and their advantages are described in detail, a person skilled in the art could make various alterations, additions, and omissions without departing from the spirit and scope of the present invention as defined by the appended claims.

What is claimed is:

1. A method for planarizing bumped die, comprising:
providing a die having a plurality of stud bumps;
encapsulating the stud bumps with an epoxy-based material;
disposing a release layer outwardly from the epoxy-based material, a surface of the release layer that engages the epoxy-based material being substantially planar;
curing the epoxy-based material; and
removing the release layer after the curing step, thereby creating a substantially planar surface of the epoxy-based material.

2. The method of claim 1, further comprising coupling the die to a flexible substrate by disposing an adhesive layer between the substantially planar surface of the epoxy-based material and the substrate.

3. The method of claim 2, wherein the flexible substrate is a polyimide.

4. The method of claim 2, wherein the adhesive layer is a polymer adhesive.

5. The method of claim 1, wherein providing the die having the plurality of stud bumps comprises:
   providing the die in a packaged format;
   testing the packaged die;
   removing the material encapsulating the die;
   removing a plurality of wire bonds associated with the die; and
   applying pressure to a plurality of wire bond balls associated with the die to create the stud bumps on the die.

6. The method of claim 1, wherein providing the die having the plurality of stud bumps comprises providing the die with a plurality of contact pads disposed beneath respective stud bumps.

7. The method of claim 1, wherein the release layer is selected from the group consisting of glass and teflon film.

8. The method of claim 1, wherein curing the epoxy-based material comprises exposing the epoxy-based material to a temperature of between ambient temperature and approximately 150° C. for a time period of between approximately fifteen minutes and approximately two hours.

9. The method of claim 1, wherein curing the epoxy-based material comprises partially curing the epoxy-based material.

10. The method of claim 1, further comprising applying pressure to the die after disposing the release layer outwardly from the epoxy-based material and before the curing step.

11. A method for assembling a multichip module, comprising:
   providing a die having a plurality of stud bumps disposed outwardly from a surface of the die, the die further having a plurality of contact pads disposed beneath respective stud bumps;
   encapsulating the stud bumps with an epoxy-based material such that the surface of the die is fully covered;
   disposing a release layer outwardly from the epoxy-based material, a surface of the release layer that engages the epoxy-based material being substantially planar;
   applying pressure to the die to compress the epoxy-based material between the die and the release layer;
   curing the epoxy-based material;
   removing the release layer after the curing step, thereby creating a substantially planar surface of the epoxy-based material; and
   coupling, after removing the release layer, the die to a flexible substrate with an adhesive layer.

12. The method of claim 11, wherein the release layer is selected from the group consisting of glass and teflon film.

13. The method of claim 11, wherein curing the epoxy-based material comprises curing the epoxy-based material by exposing the epoxy-based material to a temperature of between ambient temperature and approximately 150° C. for a time period of between approximately fifteen minutes and approximately two hours.

14. The method of claim 11, wherein the adhesive layer is a polymer adhesive.

* * * * *